United States Patent [19]

Yoshida

[11] Patent Number: 5,105,374
[45] Date of Patent: Apr. 14, 1992

[54] CIRCUIT SIMULATOR
[75] Inventor: Norio Yoshida, Suita, Japan
[73] Assignee: Mitsubishi Denki Kabushiki Kaisha, Tokyo, Japan
[21] Appl. No.: 375,904
[22] Filed: Jul. 6, 1989
[30] Foreign Application Priority Data Mar. 24, 1989 [JP] Japan ................... 1-72611

[51] Int. Cl.[5] ................ G06F 15/60; G06F 11/00; G06F 15/20
[52] U.S. Cl. .................... 364/578; 364/488; 371/23
[58] Field of Search ........... 364/578, 488, 489, 490, 364/569; 371/23, 21.2

[56] References Cited

U.S. PATENT DOCUMENTS

| 4,527,249 | 7/1985 | Van Brunt ............... 364/578 |
| 4,698,760 | 10/1987 | Lembach et al. ........ 364/488 |
| 4,736,351 | 4/1988 | Oliver ..................... 371/22.1 |
| 4,763,288 | 8/1988 | Deering et al. .......... 371/23 |
| 4,769,817 | 9/1988 | Kohn et al. .............. 371/23 |
| 4,821,220 | 4/1989 | Duisberg ................. 364/578 |
| 4,924,430 | 5/1990 | Zasio et al. .............. 371/23 |
| 4,970,664 | 11/1990 | Kaiser et al. ............ 364/488 |

FOREIGN PATENT DOCUMENTS 62-15664 1/1987 Japan .
62-15665 1/1987 Japan .

OTHER PUBLICATIONS

Jouppi; "Timing Analysis for Nmos VLSI"; 20th Design Automation Conference; 1983.
SDA Systems; "Timing Analyzer: Fast Programmable Critical Path Analysis"; 1988.
AIDA Corp. "Timing Verifier Technical Spec." 1987.

Primary Examiner—Parshotam S. Lall
Assistant Examiner—Ellis B. Ramirez
Attorney, Agent, or Firm—Oblon, Spivak, McClelland, Maier & Neustadt

[57] ABSTRACT

The circuit simulator stores an information representing a relation between the level transition on an output signal of each element in an object circuit and an input terminal to which a test pattern is applied. When a timing error occurs, an error message outputted based upon the information facilitates to narrow down the range of subjects to be analyzed for seeking the cause of the error, whereby the cause of a timing error can be easily cleared up.

6 Claims, 7 Drawing Sheets

CIRCUIT SIMULATOR

BACKGROUND OF THE INVENTION

1. Field of the Invention

The present invention relates to a circuit simulator and, more particularly, it relates to a circuit simulator for simulating operation of an electronic circuit while finding a timing error caused in respective elements thereof.

2. Description of the Background Art

In a logic circuit design, a circuit simulator is widely used as a means for verifying its logic operation and timing. Also, there exists a simulator dedicated only to the verification of operation timing.

FIG. 1 is a flowchart showing conventional process for a timing verification which is conducted in the circuit simulator.

At step S1, the circuit simulator generates an electronic state equivalently representing the condition where input test pattern signals are applied to input terminals of an object circuit to be simulated, and then calculates output signals of respective elements on the basis of operation characters and input waveforms thereof, whereby the circuit is simulated.

At step S2, it is tried to detect a timing error in input and output signals of respective elements with reference to the simulation result in Step S1.

If a timing error is detected at Step S3, the process proceeds to Step S4. At Step S4, outputted is an error message list including information as to the kind of a timing error, the time when the error was caused, the element in which the error was caused, which is useful to investigate the cause of a timing error. Meanwhile, no timing error is found at Step S3, the process proceeds to Step S5. At Step S5, it is checked whether the simulation for all the elements in the object circuit is completed. If the simulation has not been completed for one or more elements, the process returns to Step 1. Thus, Steps S1 to S5 are repeated until the simulation is completed for all the elements.

Since the conventional timing error message which is outputted from the conventional circuit simulator of includes information only as to the kind of a timing error, the time when the error was caused, the element in which the error has been caused, an operator is obliged to spend considerable time to investigate the cause of the timing error.

SUMMARY OF THE INVENTION

The present invention intended for a circuit simulator for simulating an operation of an object having interconnected electronic elements while detecting a timing error in respective operations of the electronic elements, wherein at least one of the electronic elements is a delay element, and the object circuit has a plurality of input terminals to which a given plurality of test pattern signals are applied, respectively.

According to the present invention, the circuit simulator comprises: (a) memory means having storage areas which are assigned to the electronic elements, respectively, (b) means for generating an electronic status equivalently representing a situation where the plurality of test pattern signals are applied to the plurality of input terminals of the object circuit, to simulate an operation of the object circuit under the situation, (c) means coupled to the means (a) and (b) for being informed from the means (b) that a level transition is caused on one of outputs of the electronic elements and for writing an information in a storage area which is included in the storage areas and is assigned to an electronic element on whose output the level transition is caused, there the information includes a first component representing contents of the level transition and a second component identifying an input terminal of the object circuit to which a test pattern signal causing the level transition is applied, (d) means coupled to the means (b) for detecting a timing error on respective inputs and outputs of the electronic elements in a simulation performed by the means (b), (e) means coupled to the means (a) and (d) for referring to the information written in a storage area which is included in the storage areas and is assigned to an electronic element in which the timing error is detected, to identify a test pattern signal which is included in the plurality of test pattern signals and has relation to the timing error, and (f) means coupled to the means (e) for outputting an error message including a first data representing contents of the timing error and a second data identifying the test pattern signal having relation to the timing error.

Preferably, the means (d) through (f) are enabled every time a timing error is caused in one of outputs of the electronic elements.

The circuit simulator may further comprise (g) means for continuing the simulation in the means (c) regardless of whether the timing error is detected or not until a simulation program which is previously prepared is completed.

In a preferred embodiment, the second data identifies the test pattern signal having relation to the timing error through identifying an input terminal to which the test pattern signal having relation to the timing error is applied.

The information in the memory means may include other components, and the error message may also include additional data. In particular, the present invention is suitable for a simulation of a logic circuit.

According to the invention, when a timing error occurs, information for identifying the test pattern signal which caused the error is outputted. Consequently, it becomes possible to clear up the cause of the error in relation to the test pattern signal, and thus the cause of the error is easily cleared up.

Accordingly it is an object of the present invention to provide a circuit simulator which facilitates to clear up the cause of a timing error.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 3:
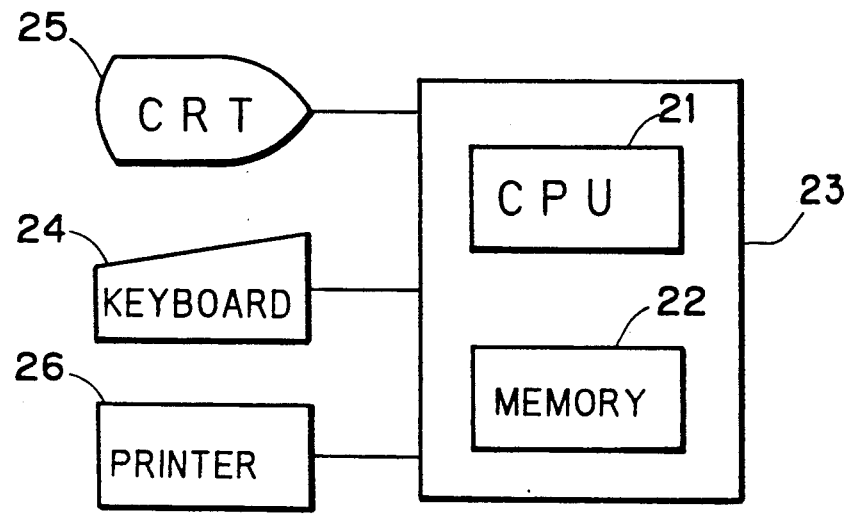
FIG. 3 is a block diagram showing a hardware construction of the circuit simulator shown in FIG. 2.

FIG. 3 is a block diagram showing a hardware construction of a circuit simulator according to a preferred embodiment of the present invention. Referring to FIG. 3, the circuit simulator includes a computer 23 having a CPU21, a memory 22 and others (not shown), a keyboard 24 as a means for inputting various informations to the computer 23, CRT 25 and a printer 26 as a means for outputting information from the computer 23. Simulation programs are previously stored in the memory 22.

Figure 1:
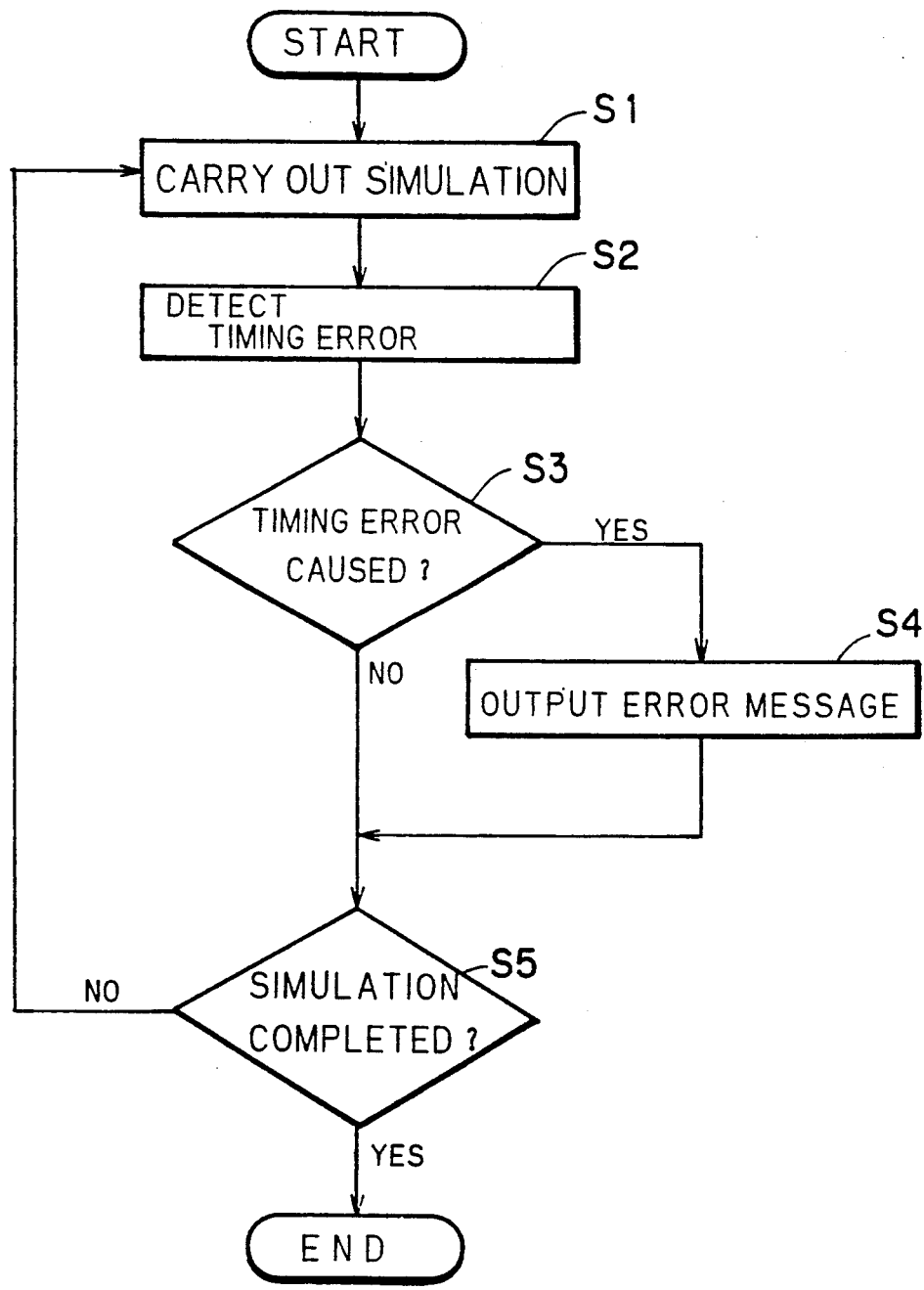
FIG. 1 is a flowchart showing a simulation process which is conducted by a conventional circuit simulator.
Figure 2:
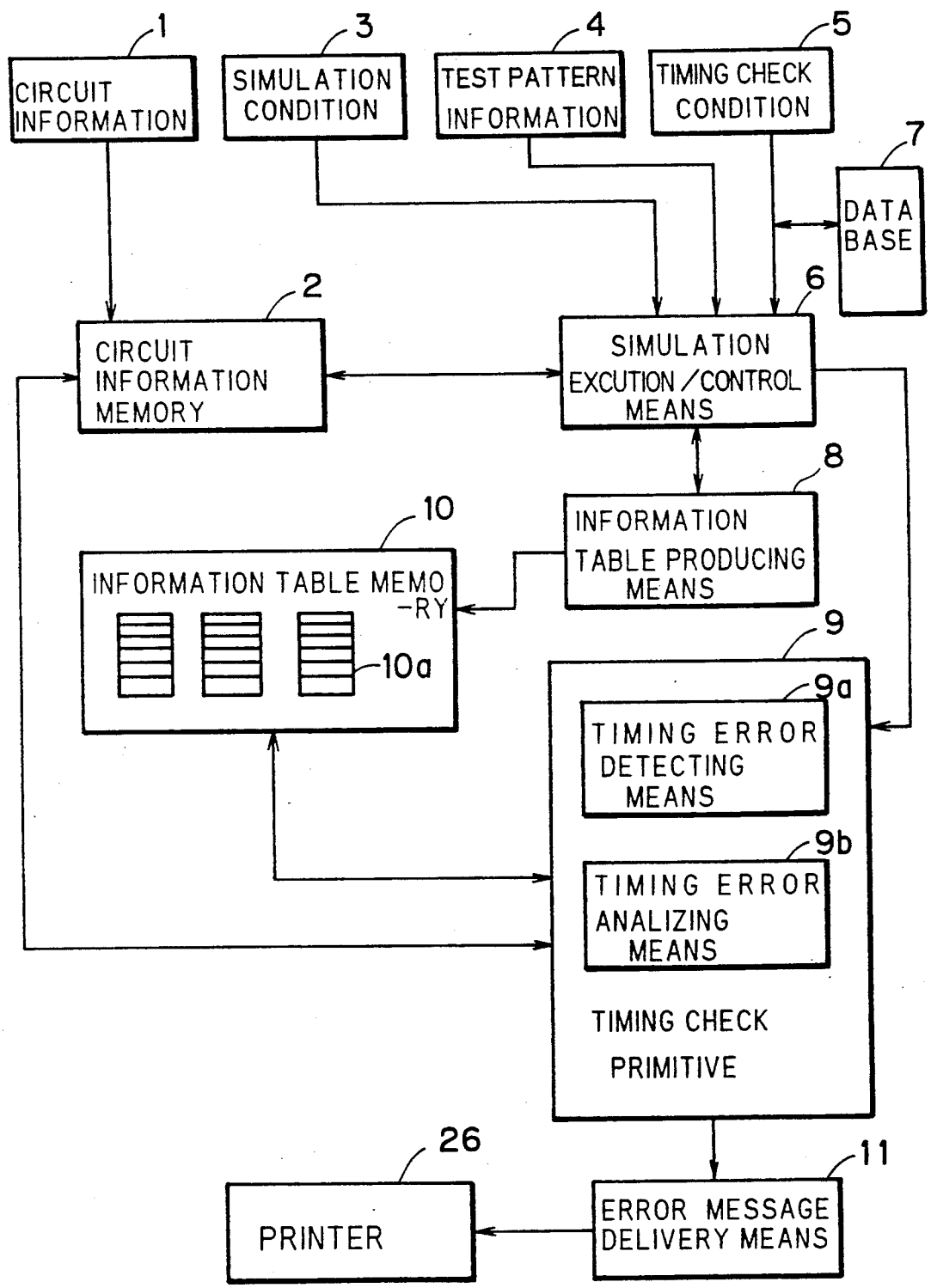
FIG. 2 is a function diagram of a circuit simulator according to a preferred embodiment of the present invention.

FIG. 2 is a function diagram showing respective functions which are attained by the circuit simulator shown in FIG. 3.

Figure 4:
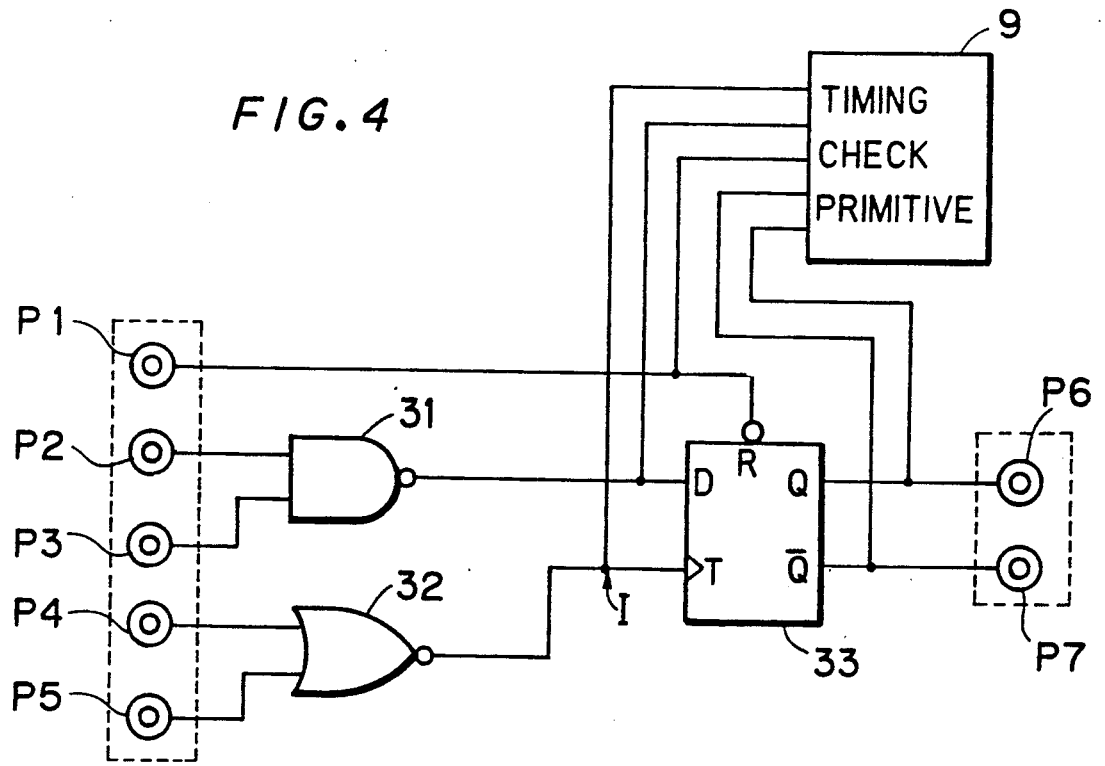
FIG. 4 is a circuit diagram in which an object circuit to be simulated and a timing check primitive are schematically depicted.

Referring to FIG. 2, a circuit information 1 representing respective electronic elements in an object circuit to be simulated and electric connections between the elements is inputted from the exterior of the circuit simulator. The circuit information 1 is then stored in a circuit information memory 2, which is a part of the memory 22 in FIG. 3. An example of the object circuit is shown in FIG. 4. The object circuit includes a NAND gate 31, a NOR gate 32 and a D flip-flop 33. These elements 31-33 are delay elements causing delays in output signals thereof. Symbols P1 to P5 denote test pattern input terminals, and P6 and P7 denote output terminals. Further, given to a simulation execution/control means 6 are a simulation condition 3 for specifying parts of the object circuit which are to be simulated, test pattern information 4 indicating respective waveforms of test patterns or input signals which are to be applied to the input terminals of the object circuit, and a timing check condition 5 representing criteria for detecting a timing error in input and output signals of respective elements. Basic timing check conditions which can be employed in timing check process regardless of the types of object circuits are prepared in a data base 7, and they are delivered to the simulation execution/control means 6 from a data base 7.

The simulation execution/control mean 6 is operable to execute and control the simulation of the object circuit by generating an electronic status equivalently representing a situation where the test patterns are applied to the input terminals of the object circuit, with reference to the circuit information I in the circuit information memory 2. The operation state of the object circuit at each simulation step is reported from the simulation execution/control means to an information table producing means 8 and a timing check primitive 9. The information table producing means 8 writes various informations on information tables 10a every time an event is caused at either of the elements and the output level of the element is changed. The information tables 10a are related to the respective elements in the object circuit, and storage areas for the information tables 10a are reserved by the information table producing means 8. The information table memory 10 is included in the memory 22 shown in FIG. 3.

If an event which causes level transition in an output signal of an electronic element is called as "level transition event", the information which is written in each information table 10a includes the following data:

(a) First data indicating a output level of the element at the time when a level transition event was detected, (b) Second data indicating the time when the level transition event was caused, (c) Third data indicating the input terminal of the object circuit from which a test pattern having caused the level transition event was supplied to the object circuit.

(d) Fourth data indicating the signal level in the input test pattern which caused the level transition event, and (e) Fifth data indicating the time when the input test pattern having caused the level transition event was supplied to the terminal.

The timing check primitive 9 has a timing error detecting means 9a. The timing error detecting means 9a monitors the respective steps of the simulation which is carried out by the simulation execution/control means 6. When a signal level is changed at either of connection lines interconnecting the elements, the timing error detecting means detects the change of the signal level, to thereby recognize a level change in the input and/or output signals of each element. Then, the timing error detecting means analyzes the level change according to the timing check condition 5, whereby a timing error in the object circuit is detected, if any.

In a case that an electronic element for which errors are checked is a flip-flop, the timing error check may include a spike check, a hazard check (i.e., a negative spike check), a relation check (i.e., a timing check between two lines) and a condition check (checking whether or not desired transitions were caused in two input pins or terminals of an electric element or a partial circuit).

In another case that checked elements form a loop circuit, the timing error check may include a race check, a spike check, a hazard check and an oscillation check.

The spike check, the hazard check and the race check are directed to timing errors which are caused by signals supplied from the exterior of the loop circuit. On the other hand, the oscillation check is directed to a timing error in a loop-circuit having an odd number of logic elements whose outputs are to be inverted from inputs thereof (e.g., NAND gates and NOR gates). When all logical elements are at active levels thereof, it is recognized that an timing error is caused in the loop circuit.

When a timing error is detected by the timing error detecting means 9a, a timing error analyzing means 9b analyzes the timing error based upon the information tables 10a corresponding to the element in which the timing error was caused, to try to find the cause of the error. The result of the analysis is outputted to an error message delivery means 11 in the form of an error message.

Figure 5:
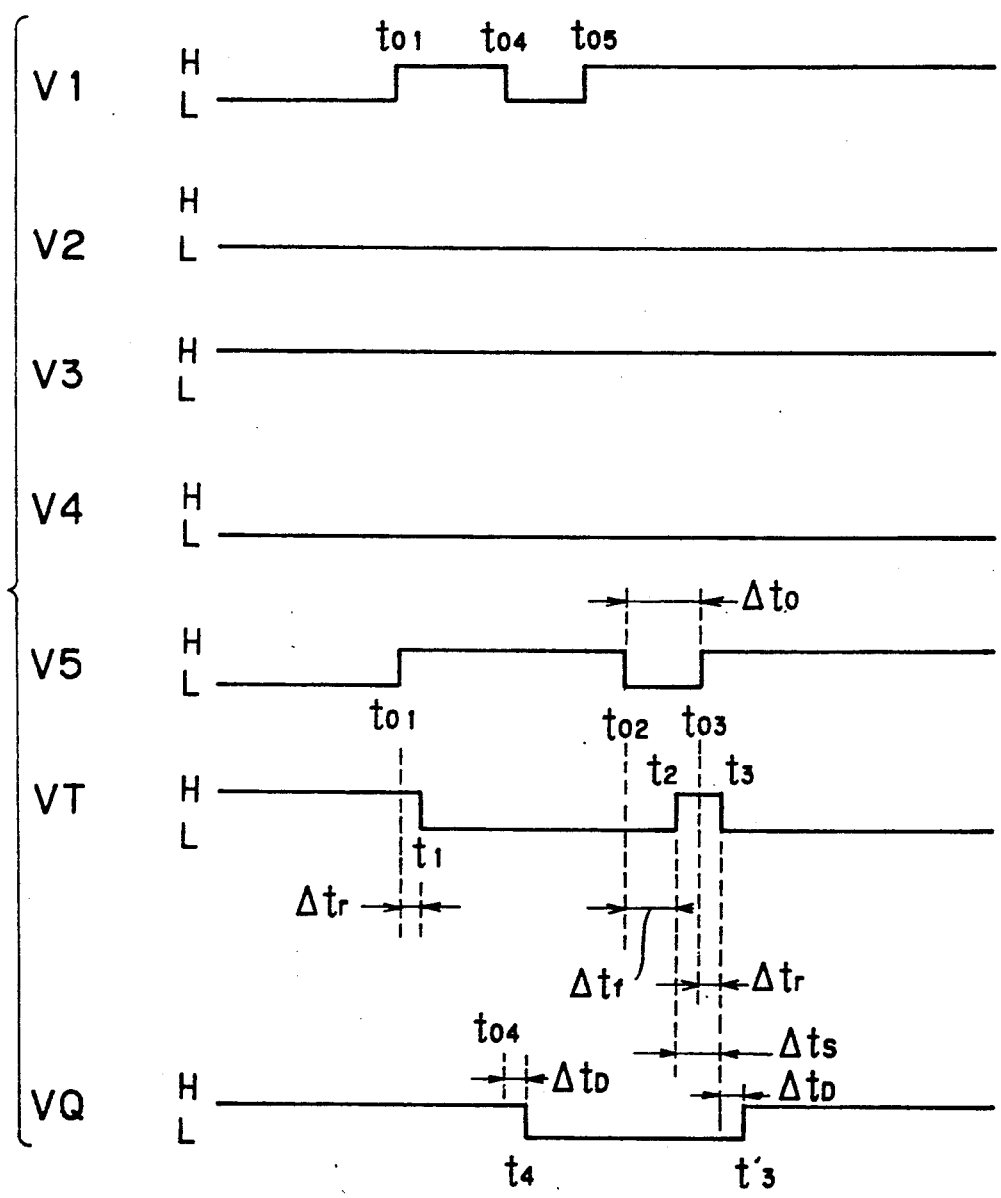
FIG. 5 is a timing chart showing waveforms at respective points in the object circuit shown in FIG. 4.
Figure 6:
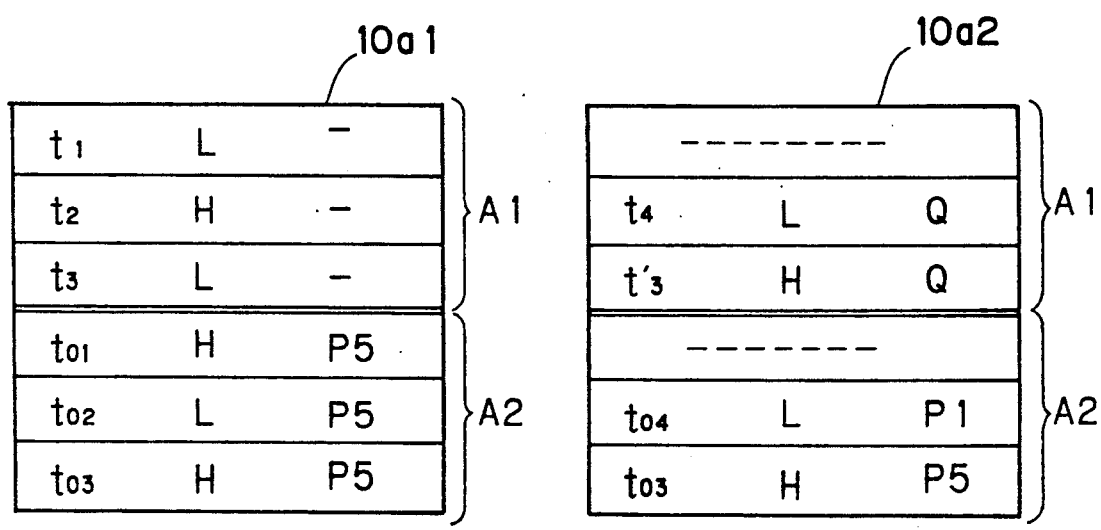
FIG. 6 is a diagram illustrating respective contents of information tables.
Figure 7:
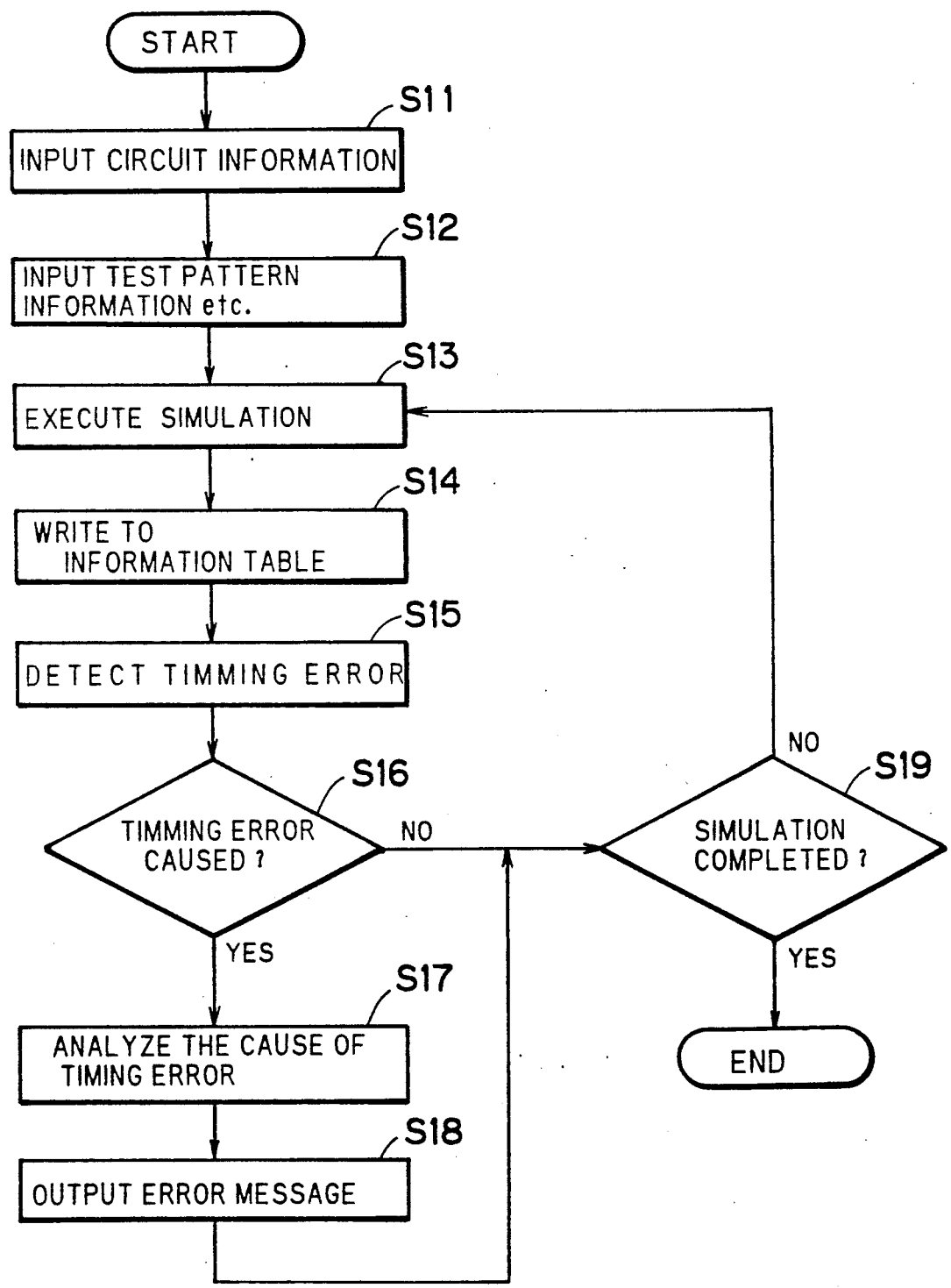
FIG. 7 is a flowchart showing a simulation process which is conducted by the circuit simulator shown in FIG. 5.

An operation of the circuit simulator will be more fully described with regard to a case in which test pattern signals V1 to V5 shown in FIG. 5 are applied to the input terminals P1 to P5 of the object circuit shown in FIG. 4, respectively. FIG. 6 shows information tables 10a1 and 10a2 for the NOR gate 32 and the flip-flop 33, respectively, which correspond to the information tables 10a shown in FIG. 2. FIG. 7 is a flowchart showing the operation of the circuit simulator.

At Step S11 in FIG. 7, the circuit information 1 for the object circuit in FIG. 4 is inputted. At Step S12, the simulation condition 3, the timing check condition 5 and the test pattern information 4 representing the test pattern signals V1 to V5 in FIG. 5 are inputted. The circuit information 1 is delivered to the circuit information memory 2, while the other informations 3-5 are transmitted to the simulation execution/condition means 6. The information table producing means 8 assigns respective storage areas of the information table memory 10 to the electronic elements 31-33 in the object circuit.

At Step S13, the simulation execution/control means 6 is enabled to start a simulation of a logic operation of the object circuit. That is, the test pattern signals V1 to V5 in FIG. 5 are applied to the input terminals P1 to P5, respectively, and then a simulation of the operation for each of the elements 31 to 88 is performed. Every time an event is caused at one of the elements 31-33 in the simulation, the information table producing means 8 writes new data to the information table 10a.

Prior to the description of the contents of the information tables 10a, a timing chart in FIG. 5 will be now described. The test pattern signals V4 and V5 in FIG. 5 are applied to the NOR gate 32 in FIG. 4. Accordingly, when V4="L" as shown in FIG. 5, a delayed and inverted value of the signal V5 appears in the element 32 as an output signal VT.

It is assumed that, in the NOR gate 32, a delay time $\Delta t_r$ for the rising of its input signal is longer than a delay time $\Delta t_f$ for the falling of the input signal. In this case, the pulse width $\Delta t_O$ in the test pattern signal V5 turns to the pulse width $\Delta t_s$ in the signal VT at the position of a node I in FIG. 4. If the pulse width $\Delta t_s$ is smaller than a threshold value $\Delta t_{th}$ (0.6 ns, for example) necessary for normal T-input in the flip-flop 33, the pulse becomes a spike.

The level transitions of the test pattern signal V1 at times $t_{01}$, $t_{04}$ and $t_{05}$ bring the level transitions in the reset input of the flip-flop 33, respectively. Further, when V2="L" and V3="H", an output of the NAND gate 31 is always at "H" level.

Meanwhile, a Q-output signal VQ of the flip-flop 33 falls to "L" level at time $t_4$ delayed by $\Delta t_D$ from time $t_{04}$ when the signal V1 as a reset signal becomes active (at "L" level). The Q-output signal VQ then rises to "H" level at time $t_3'$ which is delayed by $\Delta t_D$ from time $t_3$ when it is recognized that the signal VT or the T-input rises from "L" level to "H" Level. In a real circuit, since the "H" level pulse of the signal VT which is generated from time $t_2$ to $t_3$ is a spike, the "H" level is not recognized at time $t_3$. However, the circuit simulator is so programmed so as to recognize the "H" level for proceeding the simulation. With regard to the tables 10a, the description is given to below for a simulation stage at $t_3'$ in FIG. 5, for example.

As shown in FIG. 6, each of tables 10a (10a1,10a2) includes a first sub-table A1 and a second sub-table A2. Although not shown in FIG. 6, the information table for the NAND gate 31 is produced in the form similar to the illustrated tables 10a1 and 10a2. Each row of the first suitable A1 includes information of the time ($t_4$, $t_3$, for example, in the table 10a2) when a level transition is caused in an output signal of the corresponding element, the signal level ("H" or "L") after the transition, and information for identifying a terminal of the element in which the level transition is caused ("Q-output terminal", for example, in the table 10a2).

On the other hand, each row of the second sub-table A2 includes information identifying the test pattern signal which was applied to one of the input terminals P1 to P5 and caused the level transition being identified at the corresponding row in the first sub-table A1. That is, each row of the second sub-table A2 includes a terminal number indicating the input terminal (one of P1 to P5), information of a level transition time ($t_{04}$, $t_{03}$) in the test pattern signal which caused the level transition on the element, and the level transition information ("H" or "L") of the identified test pattern signal at that time.

The information on each row of the second sub-table A2 for an element is transferred from the information table of another element which is located in the frontside stage thereof each time a level transition is caused in an output signal of the former element. Each sub-table A1, A2 is capable to store information for at least three rows (i.e., at least three events). In an example shown in FIG. 6, information about the last three events in relation to the element is stored in each of the sub-tables A1, A2. When a new event occurs, the earliest information in each of the sub-tables A1, A2 is deleted, and information corresponding to the new event is written in place of the deleted one.

At Step S15 in FIG. 7, the detection of a timing error as previously described is performed using the timing error detecting means 9a in FIG. 2. For the purpose of the detection and others, the timing check primitive 9 is coupled to the input sides of each element as conceptionally illustrated in FIG. 4. Although the timing check primitive 9 is only coupled to the input and output sides of the flip-flop 33 for convenience of illustration, the same may be also coupled to other elements.

It is assumed that the detection of a timing error is performed based upon the timing check condition 5 in FIG. 3 and a spike of the signal VT is detected in a period of time $t_2$ to $t_3$ in FIG. 5. Then, "YES" is given to Step S16 in FIG. 7, and analyzation of the cause of error is carried out by enabling the timing error analyzing means 9b at next Step S17.

Specifically, the latest information in the information table 10a2 with regard to the element 33 in which a timing error is caused is referred to. Then, it becomes apparent that the error at time $t_3'$ is related to the level transition of the test pattern signal V5 applied to the input terminal P5 at $t=t_{03}$. After all, this proves that the cause of the error is in the test pattern signal V5 or in an element included in a circuit part or branch which is located in the signal path from the input terminal P5 to the flip-flop 83 (the NOR gate 32 in the example in FIG. 4).

An operation state of each element included in the above circuit part is analyzed in the order from the error element 33 to the input terminal P5 with reference to the information table 10a for each element. In the example shown in FIG. 6, it becomes apparent from the contents of the information table 10a1 and 10a2 that the cause of the error is a difference between the rising delay time and the falling delay time in the NOR gate 32. If the NOR gate 32 has no such defects to cause the error, the cause exists in the test pattern signal V5 applied to the input terminal P5.

The example shown in FIG. 4 includes only three elements 31 to 33, but an actual object circuit often has many elements. Accordingly, the element which caused an error can not be necessarily specified through the above mentioned procedure. However, subjects to be analyzed for the cause of an error can at least be narrowed down by recognizing the input terminal to which the test pattern signal having relation to the error has been applied to.

Figure 8:
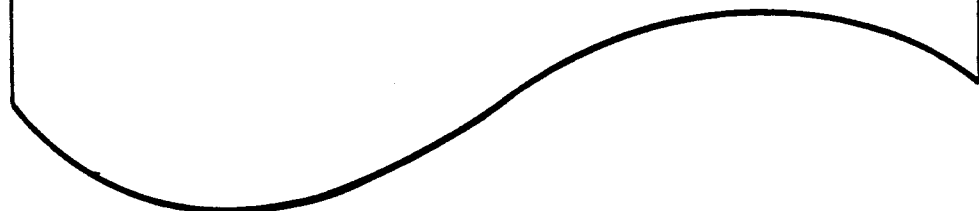
FIG. 8 is a diagram illustrating an example of an error message list.

After such an analyzation, in Step S18 in FIG. 7, the error message delivery means in FIG. 3 is enabled, whereby the error message is delivered to the printer 26 and an error message list of which part is exemplified in FIG. 8 is printed out by the printer 26. The error message includes the following informations for specifying the contents of a timing error;

(1) The identity number of the element in which the error was detected, (2) The time when the error was detected, and (3) The kind of the error.

Additionally, the following information related to the cause of the error is listed;

(4) The identity number of the input terminal from which a test pattern having relation to the error was inputted, (5) The time when the level transition was caused on the input terminal from which the test pattern having relation the error was inputted, and (6) The identity number of the element which caused the error, if specified.

Thus, the operator can easily clear up or identify the cause of a timing error in the object circuit by reading this error message list.

The process shown in FIG. 7 is repeated until the intended simulation is throughly completed. After the completion of the simulation the process proceeds from Step S19 to the end of the routine.

In the preferred embodiment, all of the information as to the above-indicated items (4) to (6) are listed in the error message list. However, as long as the list includes at least the information (4) (i.e., the information for specifying the test pattern having relation to the error within the plurality of inputted test patterns), the subject to be checked for clearing up the cause of an error can be considerably narrowed down as compared with the prior arts. Thus, although it is desirable that the error message list includes the informations as to items (4) to (6), it may include only the item (4).

Further, the object circuit may include a latch, a counter, a memory device and/or the elements to which the timing check primitive 9 is coupled, and the present invention can be applied to various object circuits. Using the information tables 10a, it is possible to find an input terminal from which a test pattern having caused level transitions on the output terminals P6 and P7 has been inputted, and it is also possible to calculate path delays from the input terminals to the output terminals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit simulator for simulating an operation of an object circuit having interconnected electronic elements while detecting a timing error in respective operations of said electronic elements, wherein at least one of said electronic elements is a delay element, and said object circuit has a plurality of input terminals to which a given plurality of test pattern signals are applied, respectively, said circuit simulator comprising:

(a) memory means having storage areas which are assigned to said electronic elements, respectively, (b) means for generating an electronic status equivalently representing a situation where said plurality of test pattern signals are applied to said plurality of input terminals of said object circuit, respectively, to simulate an operation of said object circuit under said situation, (c) means coupled to said means (a) and (b) for being informed from said means (b) that a level transition is caused on one of outputs of said electronic elements and for writing an information to a storage area which is included in said electronic storage areas and is assigned to an electronic element on whose output said level transition is caused, where said information includes a first component representing contents of said level transition, a second component identifying an input terminal of said object circuit to which a test pattern signal causing said level transition is applied, a third component representing a time when said level transition is detected, a fourth component identifying contents of a level change in said test pattern signal having relation to said timing error, and a fifth component identifying a time when said level change is caused, (d) means coupled to said means (b) for detecting a timing error on respective inputs and outputs of said electronic elements in a simulation executed by said means (b), (e) means coupled to said means (a) and (b) for referring to said information written in a storage area which is included in said storage areas and is assigned to said electronic element at which said timing error is detected, to identify a test pattern signal which is included in said plurality of test pattern signals and has relation to said timing error, and (f) means coupled to said means (e) for outputting an error message including a first data representing contents of said timing error, a second data identifying said test pattern signal having relation to said timing error, a third data identifying an electronic element in which said timing error is detected, a fourth data identifying said time of said level change in said test pattern signal having relation to said timing error, and a fifth data representing a time when said timing error is detected, wherein said means (c) identifies said test pattern signal having relation to said timing error through identifying an input terminal to which said test pattern signal having relation to said timing error is applied.

2. A circuit simulator of claim 1, wherein said means (d) through (f) are enabled every time a timing error is caused in one of outputs of said electronic elements.

3. A circuit simulator of claim 1, further comprising:

(g) means for continuing said simulation in said means (b) regardless of whether said timing error is detected or not until a simulation program which is previously prepared is completed.

4. A circuit simulator of claim 1, wherein each of said storage areas is a table area having at least three storage regions each of which is capable of storing said information.

5. A circuit simulator of claim 4, wherein said means (c) includes means for deleting an information which is written in said storage regions earliest and for writing a new information in place of a deleted information when said new information is written to said storage regions in response to a new level transition in a corresponding electronic element.

6. A circuit simulator of claim 5, wherein said object circuit is a logic circuit.

* * * * *